US006893294B2

(12) United States Patent
Moriyama et al.

(10) Patent No.: US 6,893,294 B2
(45) Date of Patent: May 17, 2005

(54) TRANSCEIVER CAGE

(75) Inventors: Keiko Moriyama, Aichi (JP); Byung Yong Kim, Aichi (JP); Michael Kandros, Aichi (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 0 days.

(21) Appl. No.: 10/646,194

(22) Filed: Aug. 22, 2003

(65) Prior Publication Data

US 2004/0042741 A1 Mar. 4, 2004

(30) Foreign Application Priority Data

Aug. 27, 2002 (JP) ........................................ 2002-246661

(51) Int. Cl.$^7$ ............................................ H01R 13/648
(52) U.S. Cl. ................................................... 439/607
(58) Field of Search ................................ 439/607, 923, 439/155, 152, 356, 357, 358

(56) References Cited

U.S. PATENT DOCUMENTS 6,203,336 B1  3/2001 Nakamura ................... 439/80
6,364,709 B1 * 4/2002 Jones .......................... 439/607
6,368,153 B1 * 4/2002 Hwang ........................ 439/607
6,558,191 B2  5/2003 Bright et al. ............. 439/541.5

* cited by examiner

Primary Examiner—Phuong Dinh
(74) Attorney, Agent, or Firm—Osha & May L.L.P.

(57) ABSTRACT

A transceiver cage to accommodate a transceiver module. The transceiver cage includes a housing having a top plate, a bottom plate, a back plate, a first side plate, and a second side plate. There is an opening at a front of the housing for the insertion of the transceiver module. The transceiver cage further includes at least one resilience piece protruding from an inner wall of the housing toward the front and a latch holding the transceiver module accommodated in the housing against a force of the resilience piece. The transceiver module is detachably accommodated in the transceiver cage by locking and releasing the latch. The resilience piece includes a first bend section having a proximal end for joining the housing and the resilience piece, a second bend section having a protruding end, and at least one intermediate bend section provided between the first bend section and the second bend section.

1 Claim, 13 Drawing Sheets

TRANSCEIVER CAGE

BACKGROUND OF THE INVENTION

1. Field of the Invention

The present invention relates to a cage to protect a transceiver module from electromagnetic interference (EMI) while accommodating the transceiver module for transmitting and receiving electrical signals or optical signals.

As the transceiver module, for example, SFP (Small Form Factor Pluggable) optical communication interface modules are given.

2. Description of the Related Art

In an optical communication system, a transceiver cage is installed, for example, at a position corresponding to a connector on a circuit board so as to accommodate a light transceiver module touchable with the connector. The light transceiver module has a facility to convert into optical signals from electrical signals or electric signals from an optical signals. In this case, it is necessary for electromagnetic interference (EMI) to be removed. The transceiver cage which is made of a metal plate functions as an electromagnetic interference (EMI) screening. Furthermore, it comprises function of protecting from damage and dust as well as the function of the electromagnetic interference (EMI) screening.

A prior-art example of such a transceiver cage is explained based on FIG. 12 and FIG. 13. FIG. 12 is a perspective view of a conventional transceiver cage watched from the base side. FIG. 13 is a drawing of resilience pieces 58a, 58b shown in FIG. 12 watched from a bottom side.

The conventional transceiver cage shown in FIGS. 12 and 13 comprises a housing 51 and two resilience pieces 58a, 58b.

The housing 51 includes a top plate 52 and a bottom plate 53 and a back plate 54 and the first side plate 55 and the second side plate 56. And, an opening 57 for accommodation a transceiver module is formed in the front.

The resilience pieces 58a, 58b, protrude toward the front side by a predetermined space in the housing 51 so that the transceiver module accommodated in the housing 51 may be pushed away to the opening 57 side.

A latch member 59 which engages with the transceiver module is provided for the housing 51 so as to hold the transceiver module accommodated in the housing 51 against a force of the resilience pieces 58a, 58b.

Engaging and releasing between the transceiver module and the latch member 59 of the housing 51 enable the transceiver module to attach to and detach from the transceiver cage.

Each upper part of the first side plate 55 and the second side plate 56 is extend from the end on the back plate side so as to make the upper extension part. Each of the resilience pieces 58a, 58b is formed by curving the upper extension part into the housing 51. As shown in FIG. 13, each of the resilience pieces 58a, 58b is consisted of a first bend section 60, a second bend section 61 and a planar section 62. The first bend section 60 constitutes an end portion on the back plate side. The second bend section 61 constitutes an end portion of the protrusion side. The planar section 62 is provided between the first bend section 60 and the second bend section 61. Each of the resilience pieces 58a, 58b protrudes from the back plate 54 side towards the opening 57 in the front of the housing 51.

The first bend sections 60 are joint portions for respectively connecting the resilience pieces 58a, 58b to the first and second side plates 55, 56. The second bend section 61 is a part for touching the transceiver module firstly, which prevent a back of the transceiver module from being scraped and injured by tips of the resilience pieces 58a, 58b. When the transceiver module is accommodated, the resilience pieces 58a, 58b press the back of the transceiver module. When engagement between the transceiver module and the housing 51 is released, the resilience pieces 58a, 58b push out and eject the transceiver module by their elasticity.

However, according to the conventional transceiver cage, there was a problem that the first bend section 60 of each resilience piece was easy to cause plastic deformation by frequent repetition of putting the transceiver module in and out the transceiver cage. When the first bend section 60 causes plastic deformation, the resilience efficiency of the resilience piece falls down then the ejection function of the transceiver module falls down. The present invention was done in view of the problem and it is the purpose to provide a transceiver cage of which a life time becomes long by improving a durability of a resilience piece.

SUMMARY OF THE INVENTION

The present invention is a transceiver cage to accommodate a transceiver module, which comprises a housing and at least one resilience piece and a latch member.

The housing comprises a top plate, a bottom plate, a back plate, the first side plate and the second side plate. An opening is provided in the front to accommodate the transceiver module.

At least one resilience piece protrudes from an inner wall of the housing toward the front.

The latch member holds the transceiver module accommodated in the housing against a force of the resilience piece.

Locking and releasing of the latch member between the transceiver module and the transceiver cage enables the transceiver module to be detachably accommodated transceiver cage.

Furthermore, to achieve the purpose, the present invention is characterized that the resilience piece comprises a first bend section, a second bend section and at least one further bend section.

The first bend section constitutes an end portion for joining the housing and the resilience piece on the back plate side. The second bend section constitutes an end portion on the protruding side. In other words, the second bend section constitutes an end portion on which the transceiver module touches firstly. At least one further bend section is provided between the first bend section and the second bend section.

Because at least one further bend section is provided between the first bend section and the second bend section, when the transceiver module is inserted, a stress added to the resilience piece is dispersed by the further bend section and hard to be concentrated on one part.

Therefore, plastic deformation of the resilience piece does not easily occur and a durability of the resilience piece improves. As a result, a life time of the resilience piece gets longer also a life time of the transceiver cage gets longer.

In addition, the transceiver module includes, for example, not only the SFP optical communication interface module but also the transceiver module for merely connecting electrical signals to electrical signals. SFP is abbreviation of Small Form Factor Pluggable. It means the transceiver of which a module part is pluggable by a plug connector part and a host connector. The plug connector part is included in a module. The host connector is implemented on a circuit board

DETAILED DESCRIPTION OF THE PREFERRED EMBODIMENTS

Referring to the accompanying drawings, a description is made of a first embodiment of the present invention.

Figure 1:
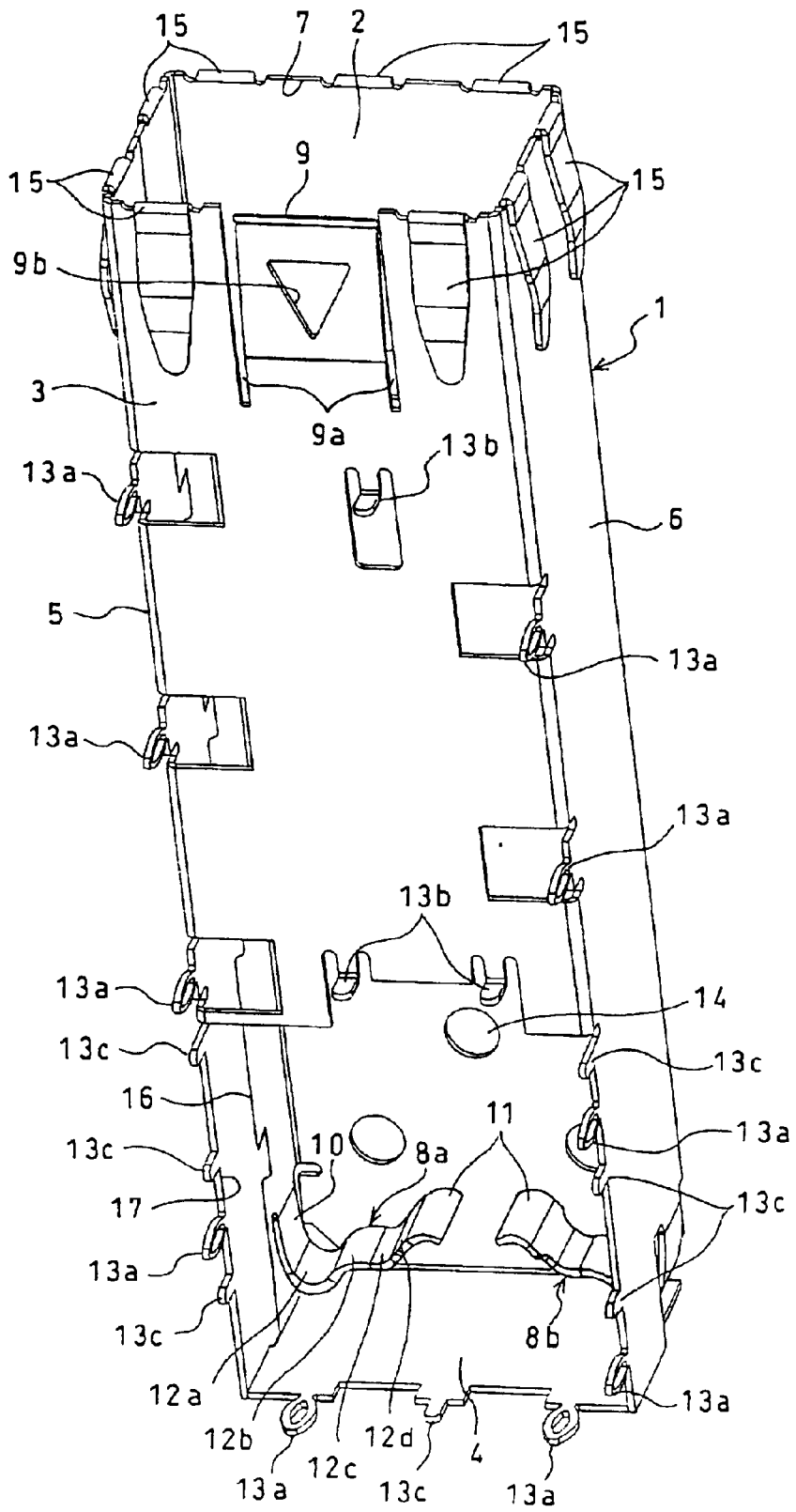
FIG. 1 is the perspective view from the base side in the first embodiment.
Figure 2:
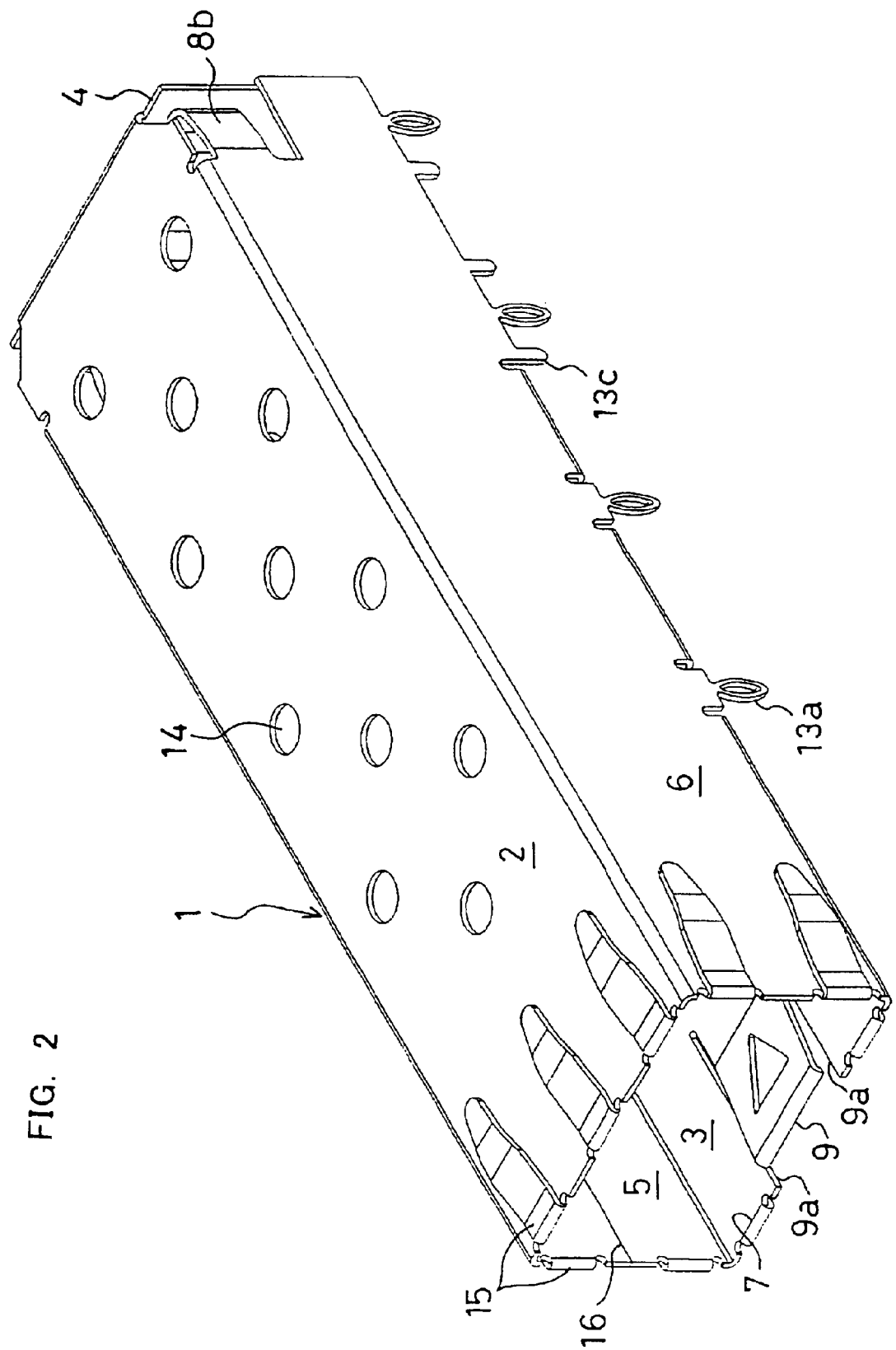
FIG. 2 is the perspective view from the top side in the first embodiment.
Figure 3:
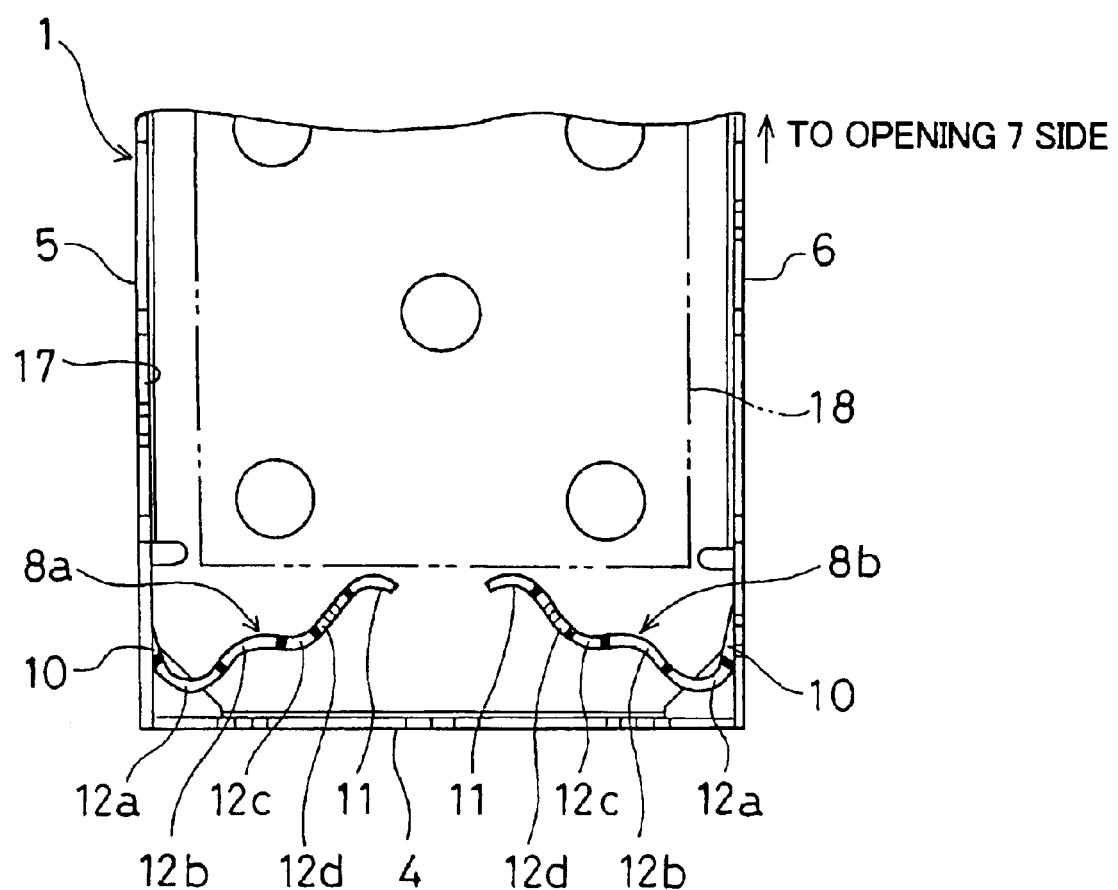
FIG. 3 is the drawing which shows the resilience pieces watched from the base side in the first embodiment.

FIG. 1 is a perspective view from a base side in the first embodiment. FIG. 2 is a perspective view from a top side in the first embodiment. In FIG. 1, symbol 1 shows a housing, 8a, 8b show resilience pieces. FIG. 3 is a drawing which shows resilience pieces watched from a base side in the first embodiment.

A transceiver cage concerning the first embodiment is made of one piece of metal plate. It is formed by knocking down a required part of the piece of metal plate into a required shape or giving bending. Symbol 16 in FIG. 1 shows a joint portion to form the piece of metal plate into the housing 1.

The housing 1 comprises a top plate 2, a bottom plate 3, a back plate 4, a first side plate 5 and a second side plate 6. A first opening 7 is provided in the front to accept and guide the transceiver module.

A lot of heat dissipation holes 14 for cooling the transceiver module is installed in the top plate 2. A length of the bottom plate 3 is shorter than the top plate 2 so as to form a second opening 17 in a bottom face on the back plate 4 side. The transceiver module is electrically connected to a circuit board at the second opening 17 through a connector installed in the second opening 17. A latch member 9 is provided around the first opening 7 for holding the transceiver module. Concretely, the latch member 9 is located in an end portion on the front side, i.e. the first opening 7 side and located around a center in a left-and right-hand direction.

The latch member 9 is a tab-shaped spring which comprises a triangular window 9b centrally. The latch member 9 is formed by cut portions 9a in a front end portion of the bottom plate 3. The cut portions 9a are cut by a required length from an front edge towards a back side of the bottom plate 3. And the latch member 9 is slightly bent into the housing 1 regarding its back end as a supporting point so as to touch resiliently to a bottom plate of the transceiver module.

An engaging portion having a projection-shape is provided for the transceiver module. When the transceiver module is completely accommodated in the housing 1, the engaging portion is fitted into the window 9b of the latch member 9, then engaged. Consequently, the transceiver module is kept accommodated in the housing 1 against a force of the resilience pieces 8a, 8b.

In addition, as the latch member, a lock piece and an engaging piece can be adopted as well as the tab-shaped spring which engages with the projection-shape engaging portion provided for the transceiver module.

Besides, when the transceiver module is not accommodated, for the purpose of a prevention of contamination of interior members and a protection of electromagnetic interference, a lid member for closing the first opening 7 is preferably provided.

The resilience pieces 8a,8b, protrude from the back plate 4 side towards the front side by a predetermined distance in the housing 1 so that the transceiver module accommodated in the housing 1 may be pushed away to the first opening 7 side. Engaging and releasing between the transceiver module and the latch member 9 of the housing 1 enable the transceiver module to attach to and detach from the transceiver cage.

The transceiver cage is mounted on the printed circuit board which is not illustrated. And, the circuit board is put in a receiving case which is installed in various kinds of equipments so as to be equipped by various kinds of equipments. The receiving case comprises a panel having a window part for exposing the connector etc. on the circuit board so that optical signals or electrical signals may be transmitted and received between the circuit board and external various devices.

The first opening 7 of the housing 1 is exposed on the panel of the receiving case. Engaging members 15 for mounting on the panel are formed around a periphery of the first opening 7, which enable the transceiver cage to be engaged with the panel and earthed.

The engaging members 15 are respectively arranged at required places on the first opening side in the end portion of the housing 1, e.g. three number of engaging members 15 are arranged at the top plate 2, two number of engaging members 15 are arranged at each side plate 5,6 and two number of engaging members 15 at the bottom plate 3. The engaging members 15 of the bottom plate 3 are arranged on both sides of the latch member 9.

An extension part of each of the top plate 2, the side plates 5,6 and the bottom plate 3 on the first opening 7 side is cut out into a plurality of strips. The engaging members 15 are formed by the plurality of the strips turned back on the outside of the housing 1. Thus described each engaging member 15 is like a strip of plate spring.

At bottom ends of both side plates 5,6, the bottom plate 3 and a bottom end of the back plate 4, a plurality of legs are arranged so that the transceiver cage may mount on a printed circuit board. In the present embodiment, the plurality of legs include mounting legs 13a, positioning legs 13b, EMI legs 13c. Depending on the application, a kind of the legs is appropriately chosen and changed.

The mounting legs 13a include solder-joint legs and solderless-joint (press fitting) legs.

Furthermore, the solder-joint legs include legs inserted and soldered in through-holes and legs soldered on patterns on the circuit board surface by SMT (Surface Mounted Technology). Depending on the application, a kind of the mounting legs is appropriately chosen and changed.

In the present embodiment, the solderless-joint legs are applied as the mounting legs 13a. Four number of the solderless-joint legs are formed at the bottom end of each side plate 5,6. They are arranged at positions wherein they do not face each other between the first side plate 5 and the second side plate 6. Accordingly, the cage is mounted on the circuit board strongly. Also, two solderless-joint legs 13a are arranged across one EMI leg 13c at the bottom end of back plate 4.

Each solderless-joint leg 13a is a ring having a substantial oval shape which is long in a vertical direction (top and bottom direction). When the cage is mounted on the printed circuit board which is not illustrated, each solderless-joint leg 13a is press-fited into the required hole opened in the circuit board, then transformed so as to become the substantial oval which is long in the horizontal direction (left-and right-hand or front and back).

By this, the solderless-joint leg 13a engages with the required hole of the circuit board, and the cage is prevented from leaving the circuit board. Such the solderless-joint leg 13a does not need soldering, and mounting the cage on the circuit board is facilitated.

When the cage is mounted on the printed circuit board which is not illustrated, the positioning legs 13b are put in required holes in the circuit board. The positioning legs 13b include legs merely put in holes and legs press-fited in and engaged with the holes. Also, the positioning leg 13b engaged with the hole has a function for temporaly tacking the cage on the printed circuit board during a soldering process and a re-flow process. Depending on the application, a kind of the positioning leg 13b is appropriately chosen and changed.

The positioning legs 13b are respectively arranged at required places, e.g. two number of the positioning legs 13b are arranged at the end of the bottom plate 3 on the second opening side, one number of the positioning leg 13b is arranged at a middle in a left and right direction around of the latch member 9.

When the cage is mounted on the printed circuit board which is not illustrated, the EMI legs 13c are put in required holes connected to a ground in the circuit board. The EMI legs 13c include legs merely put in the holes and legs press-fitted in and engaged with the holes. The legs 13c merely put in the holes are connected to the ground by soldering. The legs 13c engaged with the holes are connected to the ground by press-fitting.

Also, the leg 13c engaged with the hole has a function for temporaly tacking the cage on the printed circuit board during the soldering process and the re-flow process. Depending on the application, a kind of the EMI legs 13c is appropriately chosen and changed. The EMI legs 13c are respectively arranged at required places, e.g. three number of the EMI legs 13c are arranged surrounding the second opening 17 at the bottom end of each side plate 5,6 and one number of the EMI leg is arranged at the bottom end of the back plate 4.

Each upper part of the first side plate 5 and the second side plate 6 is extend from the end on the back plate side so as to make the upper extension part. Each of the resilience pieces 8a, 8b is formed by curving the upper extension part into the housing 1. The resilience pieces 8a, 8b are a kind of leaf springs. Each of resilience pieces 8a, 8b is a single support resilience spring of which one end is fixed and other end is released.

Each resilience piece 8a, 8b as shown in FIG. 3, comprises a first bend section 10, a second bend section 11 and a plurality of further bend sections such as a third, a fourth, a fifth and a sixth bend sections 12a,12b,12c,12d. The first bend section 10 constitutes an end portion on the housing side. The second bend section 11 constitutes an end portion on the protruding side. Further the third, the fourth, the fifth and the sixth bend sections 12a, 12b, 12c, 12d constitute portions between the first bend section 10 and the second bend section 11.

These bend sections range without borders in order of the first bend section 10, the third, the fourth, the fifth, the sixth bend sections 12a, 12b, 12c, 12d and the second bend section 11. In FIG. 3, so as to understand each bend section definitely, these are shown with thick dividing lines. The thick lines which show delimiters of the bend sections are drawn assuming the positions in which a radius of curvature varies remarkably as measures of the delimiters.

Concerning the plurality of further bend sections such as the third, the fourth, the fifth and the sixth bend sections 12a, 12b, 12c, 12d, number, bending direction and bending degree are fixed appropriately.

With the plurality of further bend sections such as the third, the fourth, the fifth, the sixth 12a, 12b, 12c, 12d, each resilience piece 8a, 8b protrudes gradually from the back plate side toward the first opening 7 side (i.e. the front) in the housing 1. A distance from the end of the housing 1 on the first opening 7 side to the second bend section of at least one resilience piece 8a, 8b is a fixed required length. The resilience pieces 8a, 8b protrude in symmetry by a substantially same distance from the end portions of the right and left side plates 5,6 on the back plate side toward the center in the housing 1.

The first bend sections 10 are joint portions for respectively connecting the resilience pieces 8a, 8b to the first and second side plates 5,6. Each first bend section 10 protrudes from the front side to the back side with slightly curving toward the inside of the housing 1.

The each third bend section 12a is a bend section which turn the protruding direction of the resilience piece 8a, 8b from the back plate 4 side (i.e. the back side) to front side.

Because of the first bend section 10, a radius of curvature of the third bend section 12a can be large in comparison that the resilience piece stands up directly from the side plate 5,6 toward the front.

The fourth bend section 12b turns the protruding direction of the resilience piece 8a, 8b slightly from the front side toward the back plate 4 side. The fifth bend section 12c turns the protruding direction of the resilience piece 8a, 8b from the back plate 4 side to the front side again.

The sixth bend section 12d is a bend section for continuing the resilience piece 8a, 8b smoothly from the fifth bend section 12c to the second bend section 11 with keeping the protruding direction of the resilience piece 8a, 8b intact (i.e. toward the front side).

The second bend section 11 is a part for touching a transceiver module 18 firstly, which prevent a back of the transceiver module 18 from being scraped and injured by tips of the resilience pieces 8a, 8b.

When the transceiver module 18 is accommodated, the resilience pieces 8a, 8b press the back of the transceiver module 18. When engagement between the transceiver module 18 and the housing 1 is released, the resilience pieces 8a, 8b push out and eject the transceiver module by their elasticity.

Next, an action of the resilience pieces 8a, 8b of the transceiver cage concerning the first embodiment having the above described construction is explained.

The transceiver module 18 is inserted from the first opening 7 into the inside of the transceiver cage. The transceiver module 18 contacts with the second bend sections 11 firstly. As the insertion of the transceiver module 18 progresses, the second bend sections 11 which are the end portions of the resilience pieces 8a, 8b on the protruding side are gradually pushed toward the back. A stress of the case is dispersed and hard to be concentrated on one part since the plurality of the bend sections 10,12a, 12b, 12c, 12d sag down in each.

Therefore, a plastic deformation does not occur easily even if the transceiver module 18 is frequently and repetitively put in and out the transceiver cage. And a durability of the resilience pieces 8a, 8b improves. As a result, a life time of the resilience pieces 8a, 8b become long, also a life time of the transceiver cage gets longer.

In addition, the number of resilience pieces is two in the above, however, the number of resilience pieces is optionally fixed.

Further, a shape of one leaf spring is allowed to be made like a line to make its width small and thin. As a cross section of the line-shape spring, a polygon such as quadrangles or a circle is allowable.

Besides, each resilience piece 8a, 8b is formed only by a sequence of the plurality of bend sections in the above. However, resilience piece is allowed to be formed by a sequence of the first bend section, the second bend section, at least one further bend section and at least one planar section including a straight line portion.

The at least one further bend section is provided between the first bend section and the second bend section. The at least one planar section is provided between the first bend section and the second bend section.

Further, in the above described embodiment, the resilience pieces 8a, 8b protrude into the housing 1 from both side plates 5,6. However, resilience pieces 8a, 8b are allowed to protrude into the housing 1 from the back plate 4, such as the resilience pieces 8a, 8b formed by punching out a part of a material of the back plate 4.

Further, in the above described embodiment, to view from the first opening 7 of the housing 1, resilience pieces 8a, 8b protrude in symmetry in the housing 1 from right and left side plates 5,6 by an approximately same length. However, concerning the length of resilience pieces protruding into the housing 1, one is allowed to be shorter than the other as far as a distance from the end of the housing 1 on the first opening 7 side to the second bend section of at least one resilience piece is required length.

Further, in the above described embodiment, the resilience pieces 8a, 8b protrude from the right and left side into the housing 1 respectively. However, all of resilience pieces are allowed to protrude from one side to the other side.

Further, in the above described embodiment, a transceiver cage is formed with one piece of metal plate. However, each part member are allowed to produce separately, then by joining and fitting them, the transceiver cage is allowed to be assembled. For example, the housing is comprised of a main body for accommodation and a cover. The main body of accommodation consists of a bottom plate and a back plate and first and second side plates. The cover covers the main body at a top face.

Further, a housing is allowed to be formed by putting a first member and a second member together. For example, the first member consists of a bottom plate, a first side plate and second side plate. The second member consists of a back plate and a top plate. The first member and the second member are put together then a transceiver cage is assembled.

Further, each resilience piece is allowed to be separately formed with a housing. In this case, then each resilience piece is joining and fitting with the housing.

Next, other embodiments are explained, which are variously devised to adjust an elasticity of a resilience piece.
(The Second Embodiment)

Figure 4:
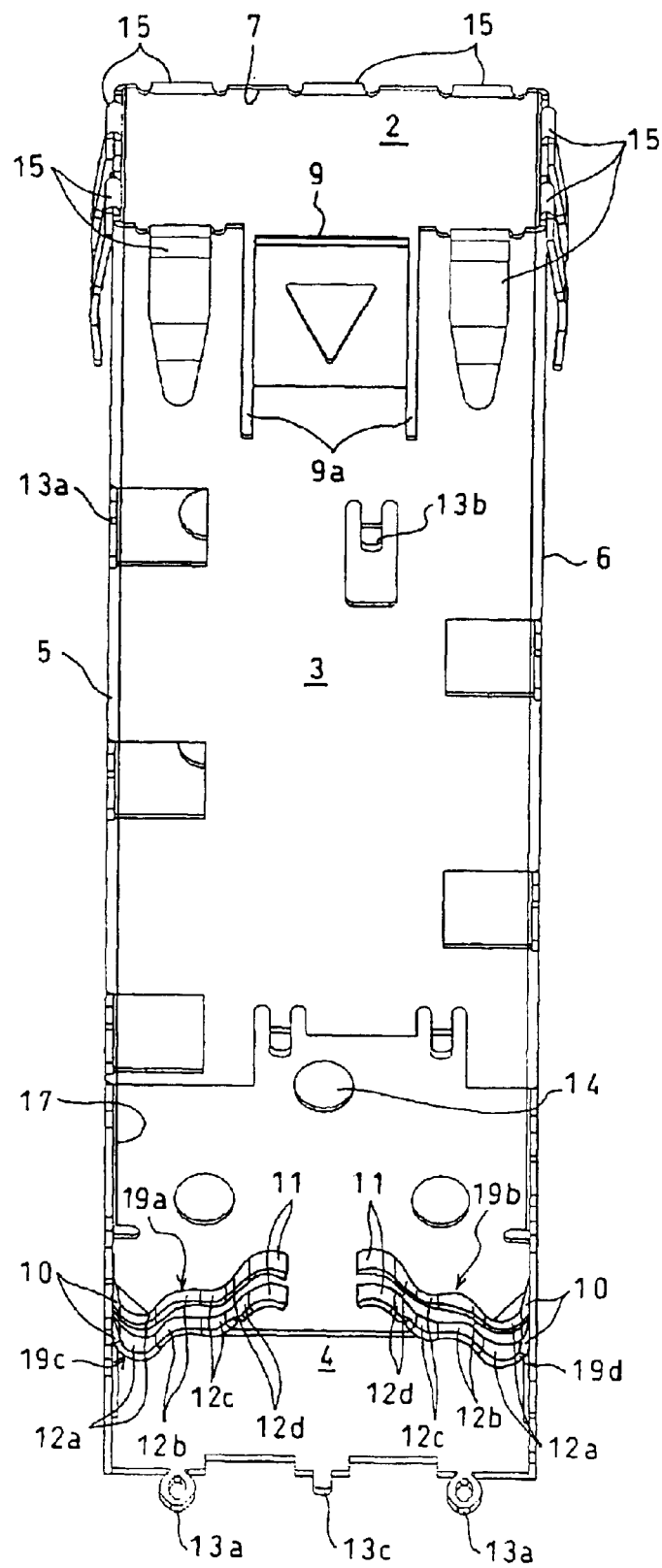
FIG. 4 is the drawing which shows the resilience pieces watched from the base side in the second embodiment.

The second embodiment is shown in FIG. 4. FIG. 4 is a perspective view with an angle to show the first opening 7 from the base side.

Resilience pieces 19a, 19b, 19c, 19d of a transceiver cage shown in FIG. 4 are corresponded to ones in a case that each resilience piece 8a, 8b in the first embodiment is split into two. Other things except this are similar to the first embodiment, so description is omitted.
(The Third Embodiment)

Figure 5:
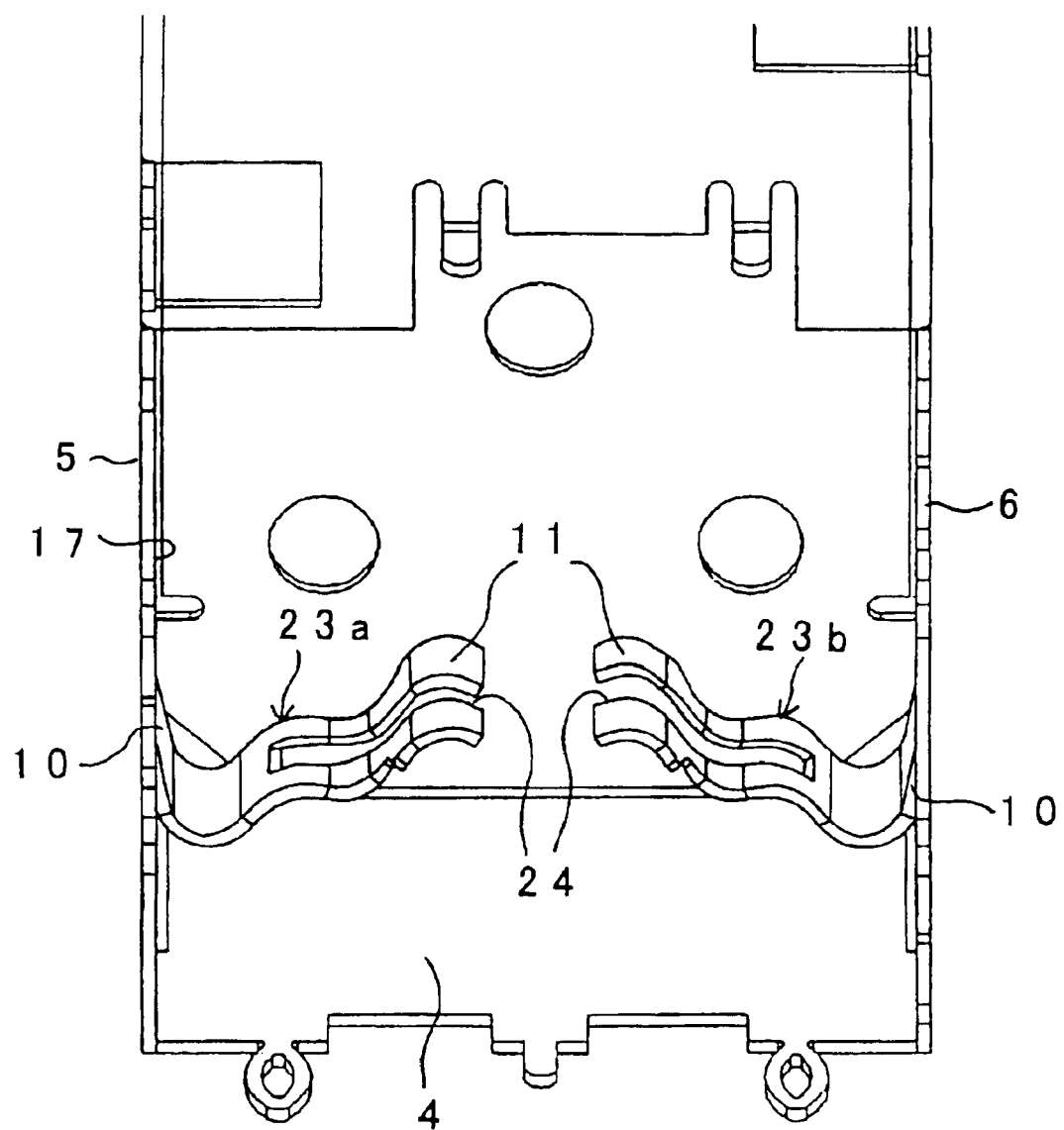
FIG. 5 is the drawing which shows the resilience pieces watched from the base side in the third embodiment.

The third embodiment is shown in FIG. 5. FIG. 5 is a drawing showing resilience pieces 23a, 23b of a transceiver cage, which is a perspective view with an angle to show a back face 4 from the second opening 17 of a bottom face.

At least one resilience piece 23a, 23b of a transceiver cage shown in FIG. 5 is formed by punching out at least one leaf spring of resilience piece 8a, 8b in the first embodiment longitudinally from a leading edge on the protruding side with a required spreading by a required length. Symbol 24 shows the punching portions.

An elasticity of the resilience piece can be adjusted by changing an area of the punching part. Other things except these are similar to the first embodiment, so description is omitted.
(The Fourth Embodiment)

Figure 6:
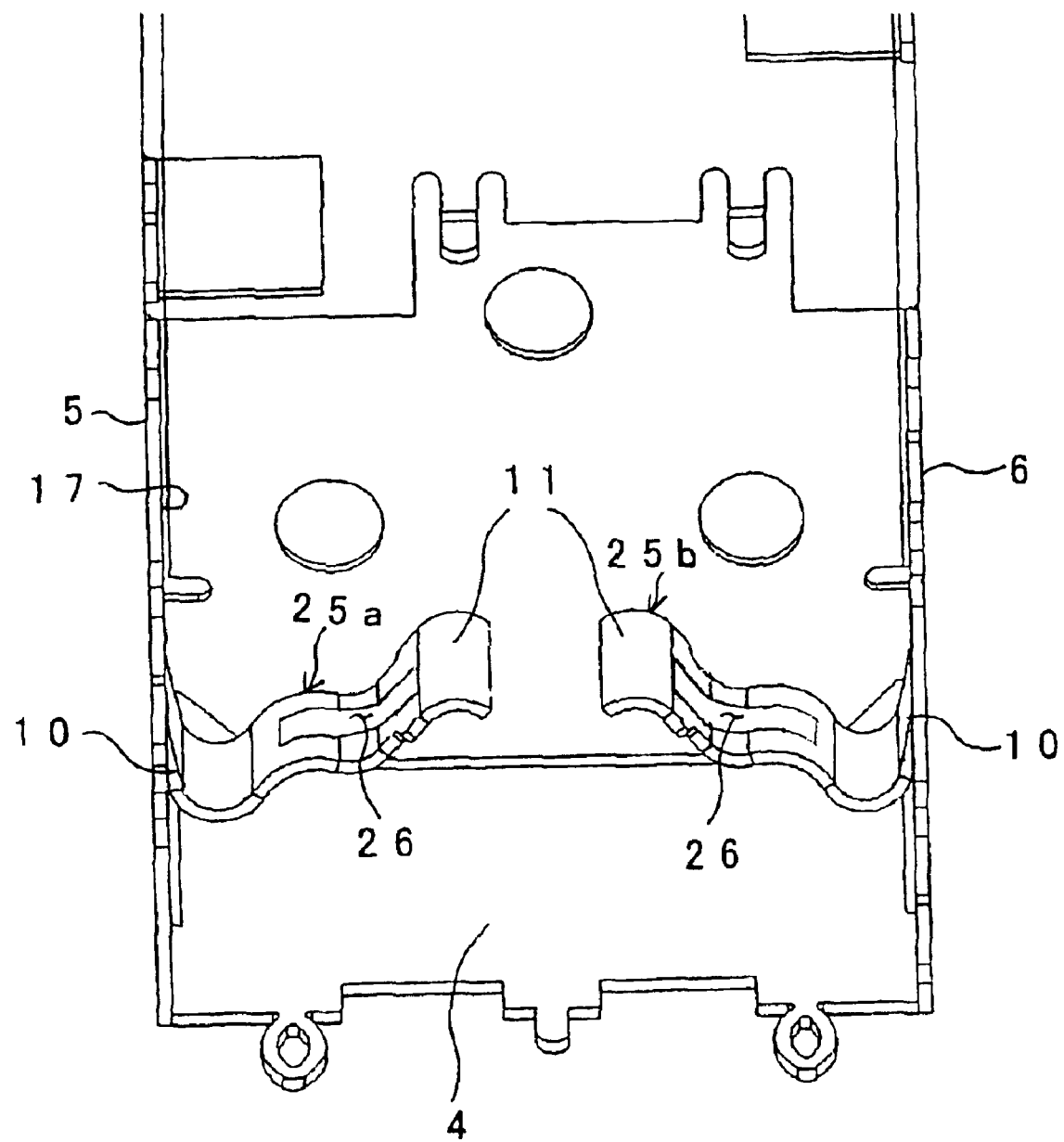
FIG. 6 is the drawing which shows the resilience pieces watched from the base side in the fourth embodiment.

The fourth embodiment is shown in FIG. 6. FIG. 6 is a drawing showing resilience pieces 25a, 25b of a transceiver cage, which is a perspective view with an angle to show a back face 4 from the second opening 17 of a bottom face.

At least one resilience piece 25a, 25b of a transceiver cage shown in FIG. 6 is formed by punching out at least one leaf spring of resilience piece 8a, 8b in the first embodiment longitudinally around a middle with a required spreading by a required length. Symbol 26 shows the punching portions.

An elasticity of the resilience piece can be adjusted by changing an area of the punching part.

Further, a contact to the transceiver module is easily and adequately adjusted since an edge of the resilience piece on the protruding side is not divided in comparison with the case of the second and the third embodiments.

Other things except these are similar to the first embodiment, so description is omitted.
(The Fifth Embodiment)

Figure 7:
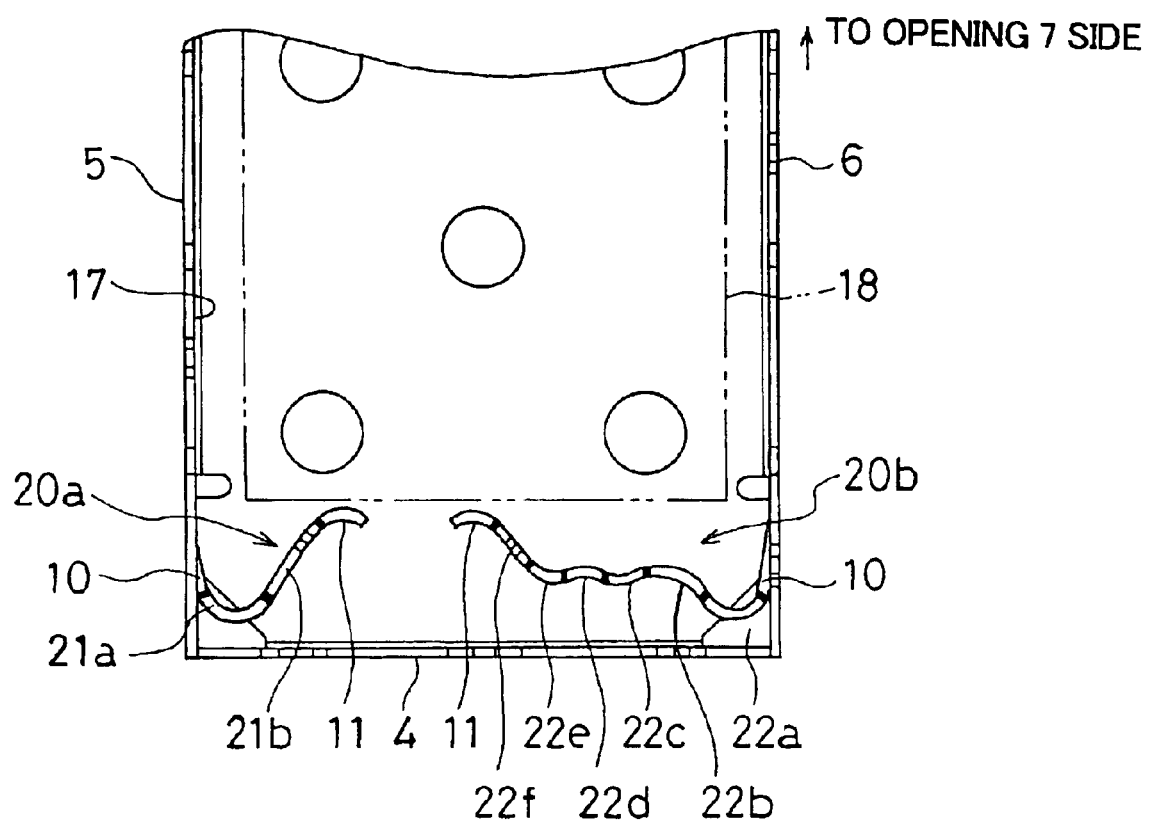
FIG. 7 is the drawing which shows the resilience pieces watched from the base side in the fifth embodiment.

The fifth embodiment is shown in FIG. 7. FIG. 7 is a sectional view from a base side in which a first and second resilience pieces 20a, 20b are definitely seen.

Each upper part of the first side plate 5 and the second side plate 6 is extend from the end on the back plate side so as to make the upper extension part. Each of the resilience pieces 20a, 20b is formed by curving the upper extension part into the housing 1. The resilience pieces 20a,20b are a kind of leaf springs. Each of resilience pieces 20a, 20b is a single support resilience spring of which one end is fixed and other end is released.

In the present embodiment, to view from the first opening 7 of the housing 1, concerning the length of resilience pieces 20a, 20b protruding into the housing 1, one 20a is shorter than the other 20b.

The resilience piece 20a comprises a first bend section 10, a second bend section 11 and a plurality of further bend sections such as a third and a fourth bend sections 21a, 21b.

The first bend section 10 constitutes an end portion on the housing side. The second bend section 11 constitutes an end portion on the protruding side. The third and the fourth bend sections 21a, 21b constitute portions between the first bend section 10 and the second bend section 11.

The resilience piece 20b comprises a first bend section 10, a second bend section 11 and a plurality of further bend sections such as a third, a fourth, a fifth, a sixth, a seventh and an eighth bend sections 22a, 22b, 22c, 22d, 22e, 22f.

The first bend section 10 constitutes an end portion on the housing side. The second bend section 11 constitutes an end portion on the protruding side. The third, the fourth, the fifth, the sixth, the seventh and the eighth bend sections 22a, 22b, 22c, 22d, 22e, 22f constitute portions between the first bend section 10 and the second bend section 11.

These bend sections of the first and the second resilience pieces 20a, 20b range without borders. However, in FIG. 7, so as to understand each bend section definitely, these are shown with thick dividing lines.

Concerning the plurality of further bend sections such as the third bend sections 21a, 22a and so on, a number, a bending direction and a bending degree are fixed appropriately.

With the plurality of further bend sections such as the third bend sections 21a, 22a and so on, each resilience piece 20a, 20b protrudes gradually from the back plate side toward the first opening 7 side (i.e. the front side) in the housing 1. A distance from an end of the housing 1 on the first opening 7 side to the second bend section of at least one resilience piece 20a,20b is a fixed required length.

The first bend sections 10 are joint portions for respectively connecting the resilience pieces 20a, 20b to the first and second side plates 5,6. Each first bend section 10 protrudes from the front side to the back side with slightly curving toward the inside of the housing 1. The each third bend section 21a, 22a is a bend section which turn the protruding direction of the resilience piece 20a, 20b from the back plate 4 side (i.e. the back side) to front side.

Because of the first bend section 10, a radius of curvature of the third bend section 21a, 22a can be taken large in comparison that the resilience piece stands up directly from the side plate 5,6 toward the front.

The second bend section 11 is a part for touching a transceiver module 18 firstly, which prevent a back of the transceiver module 18 from being scraped and injured by tips of the resilience pieces 20a, 20b.

When the transceiver module 18 is accommodated, the resilience pieces 20a, 20b press the back of the transceiver module 18. When engagement between the transceiver module 18 and the housing 1 is released, the resilience pieces 20a, 20b push out and eject the transceiver module by their elasticity.

Other things except these are similar to the first embodiment, so description is omitted.

(The Sixth Embodiment Example)

Figure 8:
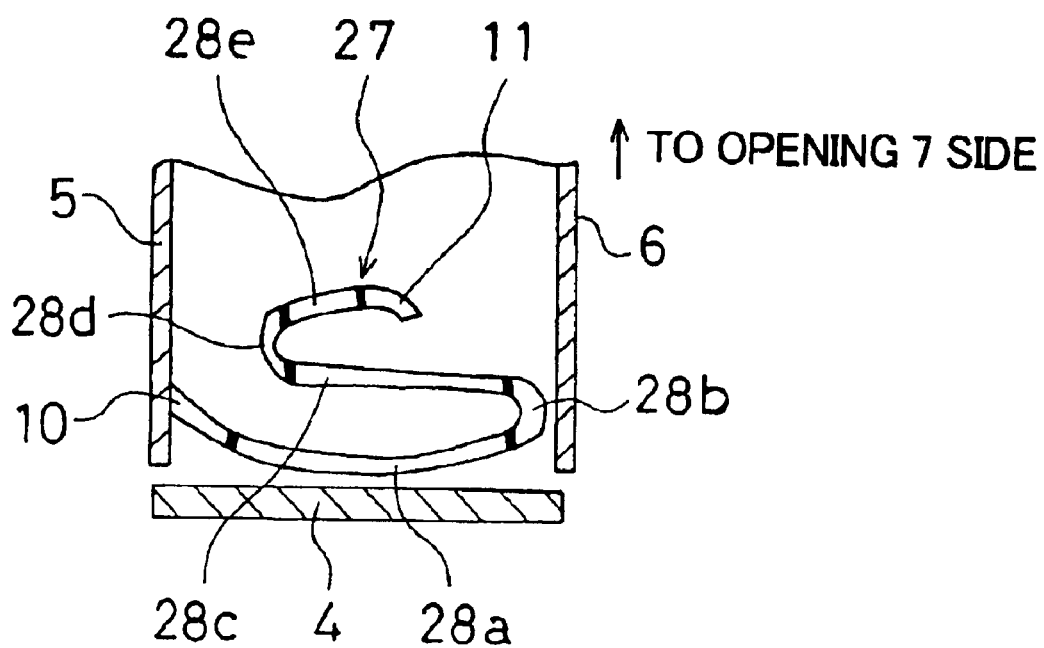
FIG. 8 is a fragmentary sectional view in which the resilience piece is watched from the base side in the sixth embodiment.

The sixth embodiment example is shown in FIG. 8. FIG. 8 is a partial sectional view from a base side in which a resilience piece 27 is definitely seen.

An upper part of the first side plate 5 is extend from the end on the back plate side so as to make the upper extension part. As shown in FIG. 8, the resilience pieces 27 is formed by curving the upper extension part into the housing 1. The resilience piece 27 is a kind of leaf spring. The resilience piece 27 is a single support resilience spring of which one end is fixed and other end is released.

The resilience piece 27 comprises a first bend section 10, a second bend section 11 and a plurality of further bend sections such as a third, a fourth a fifth, a sixth and a seventh bend sections 28a, 28b, 28c, 28d, 28e. The first bend section 10 constitutes an end portion on the housing side. The second bend section 11 constitutes an end portion on the protruding side. The third, the fourth, the fifth, the sixth, and the seventh bend sections 28a, 28b, 28c, 28d, 28e constitute portions between the first bend section 10 and the second bend section 11. These bend sections of the resilience piece 27 range without borders. However, in FIG. 8, so as to understand each bend section definitely, these are shown with thick dividing lines.

With the plurality of further bend sections such as the third bend sections 28a and so on, the resilience piece 27 protrudes gradually from the back plate side toward the first opening 7 side (i.e. the front side) in the housing 1. A distance from an end of the housing 1 on the first opening 7 side to the second bend section of the resilience piece 27 is a fixed required length. Seeing from the first opening 7, the resilience single 27 protrudes from the end portion of the first side plate 5 on the back plate 4 side to the second side plate 6. The first bend section 10 is a joint portion for connecting the resilience piece 27 to the first side plates 5. The first bend section 10 protrudes from the front side toward the back side with curving to the inside of the housing 1. The third bend section 28a is a bend section which turn the protruding direction of the resilience piece 27 from the back plate 4 side (i.e. the back side) to front side.

Because of the first bend section 10, a radius of curvature of the third bend section 28a can be taken large in comparison that the resilience piece stands up directly from the first side plate 5 toward the front.

The fourth bend section 28b turns the protruding direction of the resilience piece 27 from the second side plate 6 toward the first side plate 5. The sixth bend section 28d turns the protruding direction of the resilience piece 27 from the first side plate 5 toward the second side plate 6. The third, the fifth, the seven bend sections 28a, 28c, 28e are bend sections for connecting smoothly among of the first, the fourth, the sixth, second bend sections 10,28b, 28d, 11. The second bend section 11 is a part for touching a transceiver module firstly, which prevent a back of the transceiver module from being scraped and injured by tips of the resilience piece 27.

When the transceiver module is accommodated, the resilience piece 27 press the back of the transceiver module. When engagement between the transceiver module and the housing is released, the resilience piece 27 push out and eject the transceiver module by its elasticity.

Other things except these are similar to the first embodiment, so description is omitted.

(The Seventh, the Eighth, the Ninth Embodiment)

Figure 9:
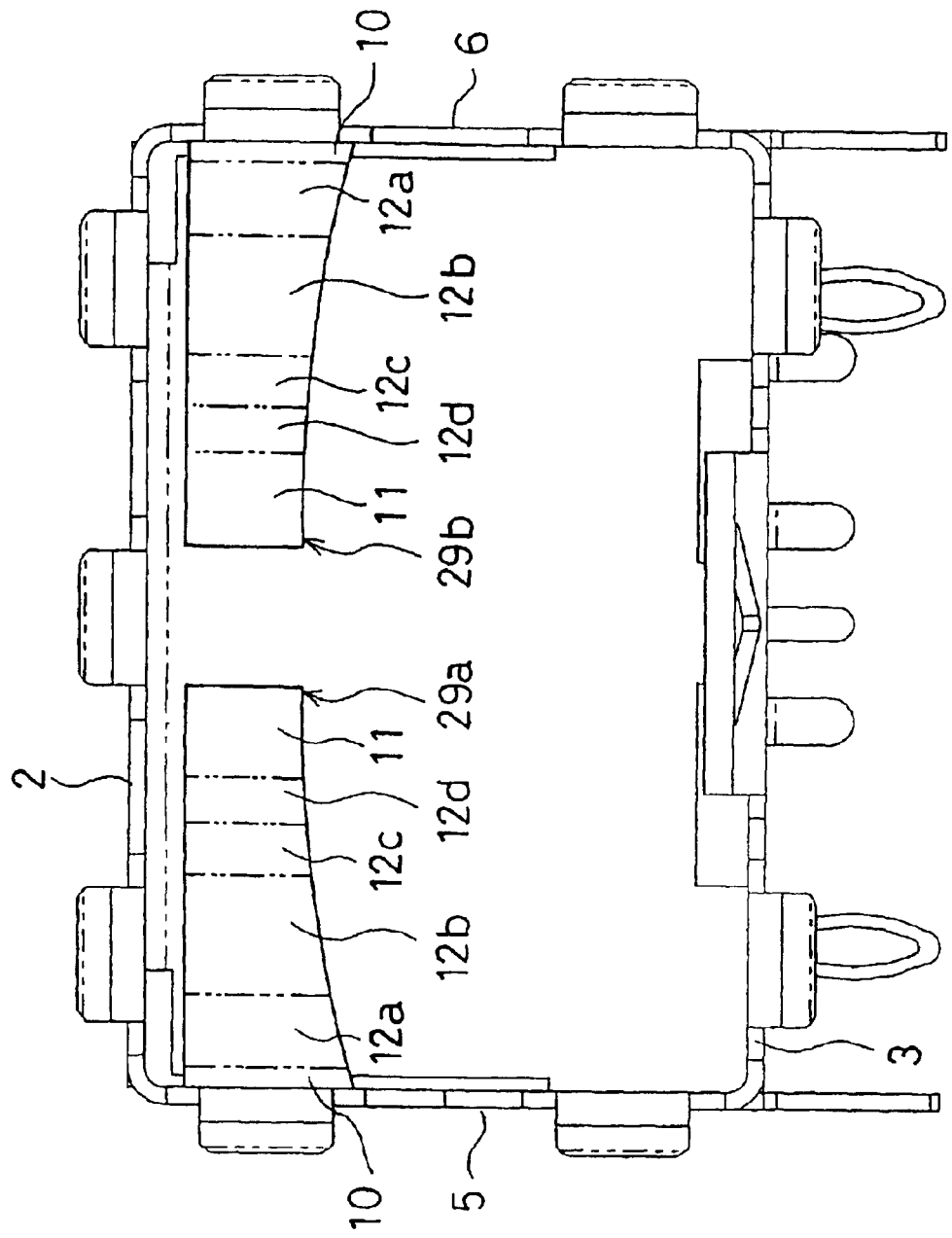
FIG. 9 is the drawing which shows the resilience pieces watched from the front side in the seventh embodiment.
Figure 10:
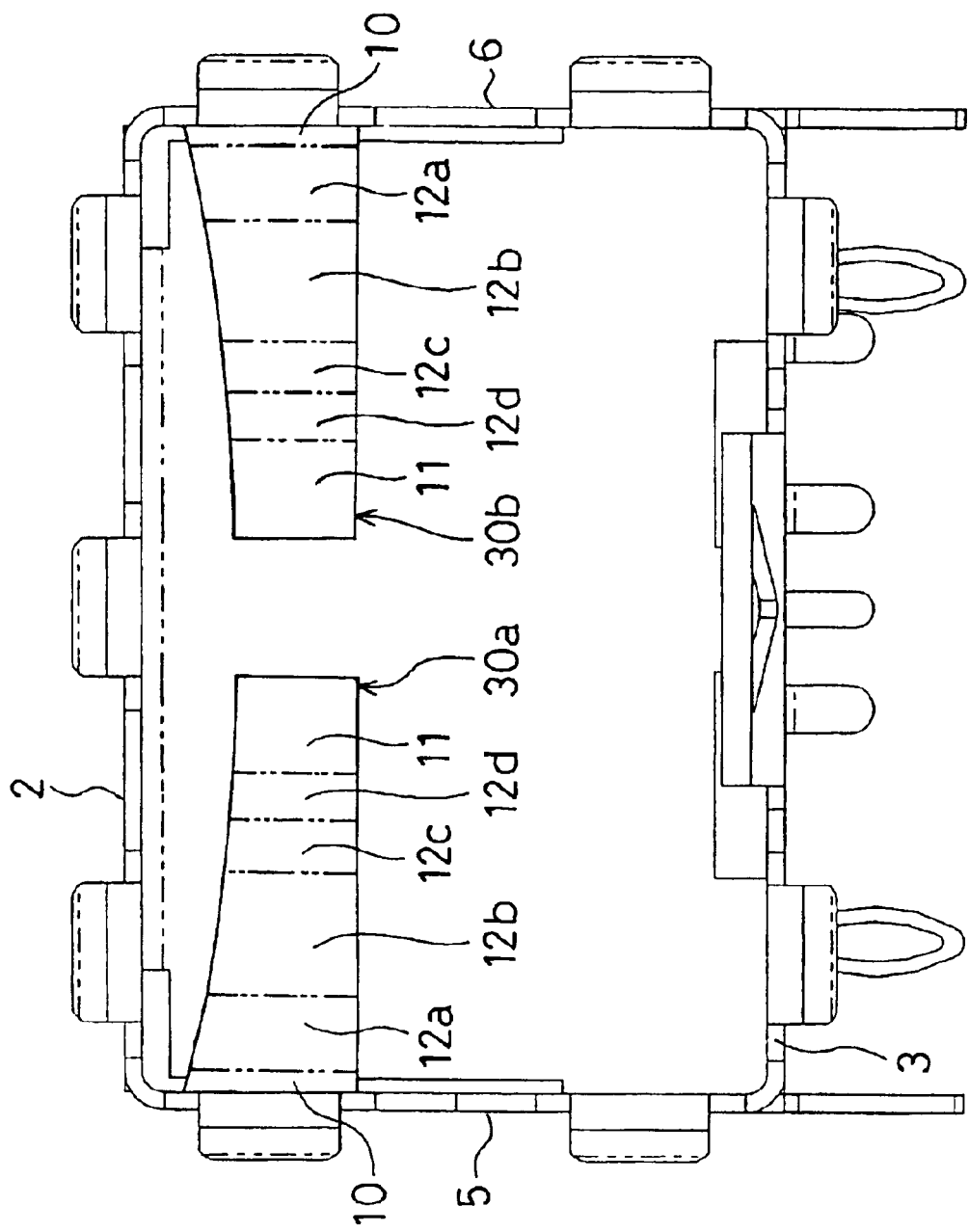
FIG. 10 is the drawing which shows the resilience pieces watched from the front side in the eighth embodiment.
Figure 11:
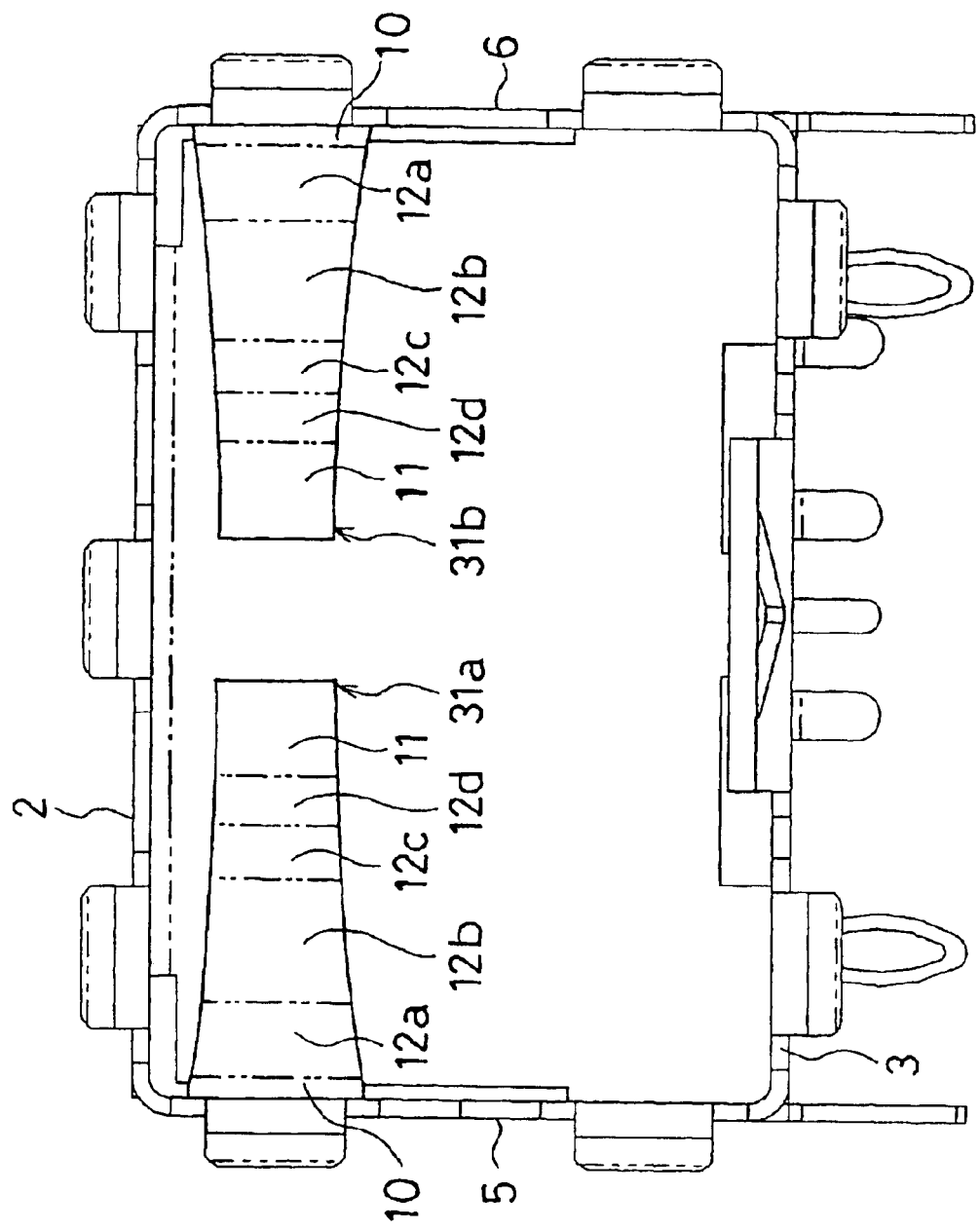
FIG. 11 is the drawing which shows the resilience pieces watched from the front side in the ninth embodiment.
Figure 12:
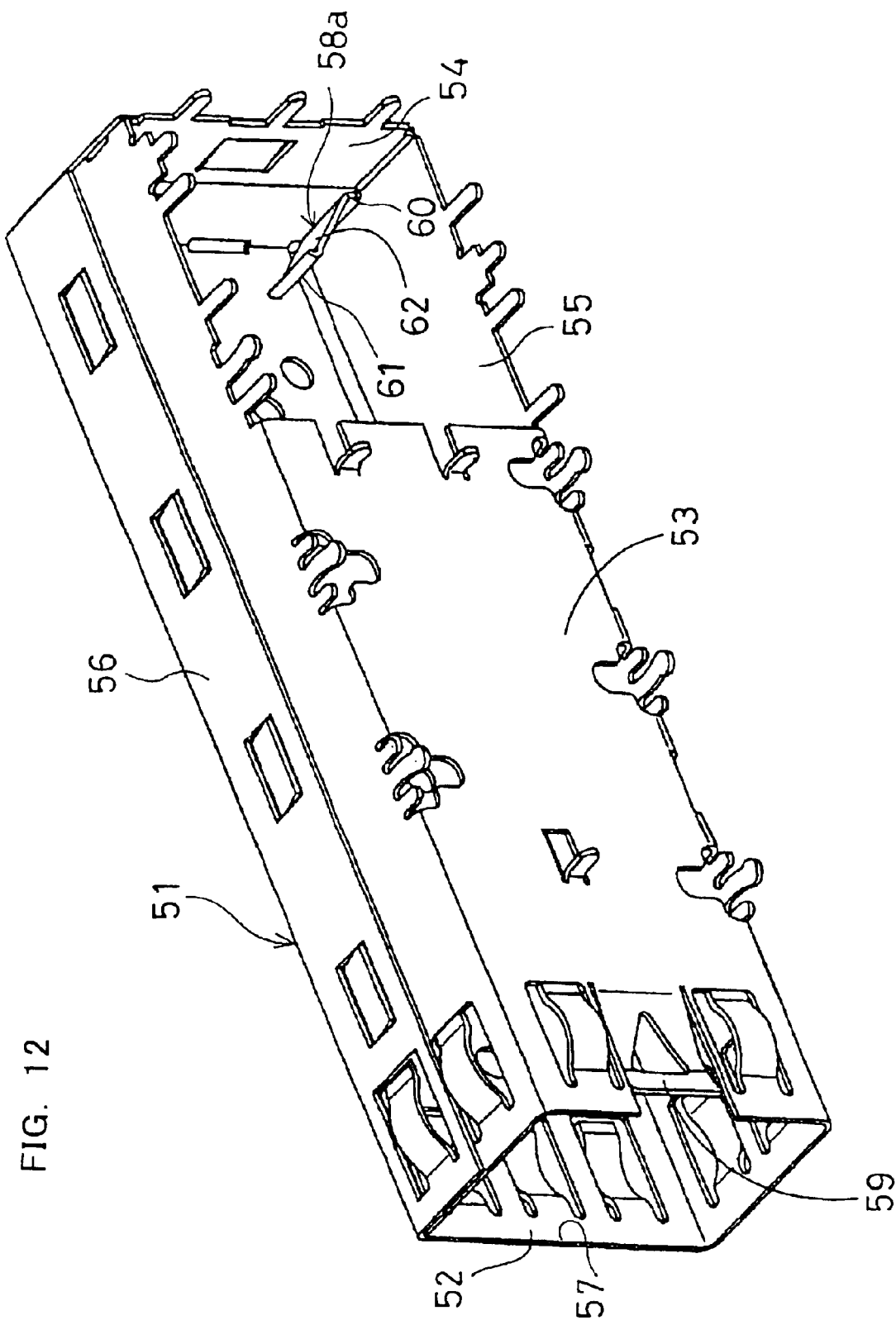
FIG. 12 is the perspective view in which the conventional transceiver cage is watched from the base face.
Figure 13:
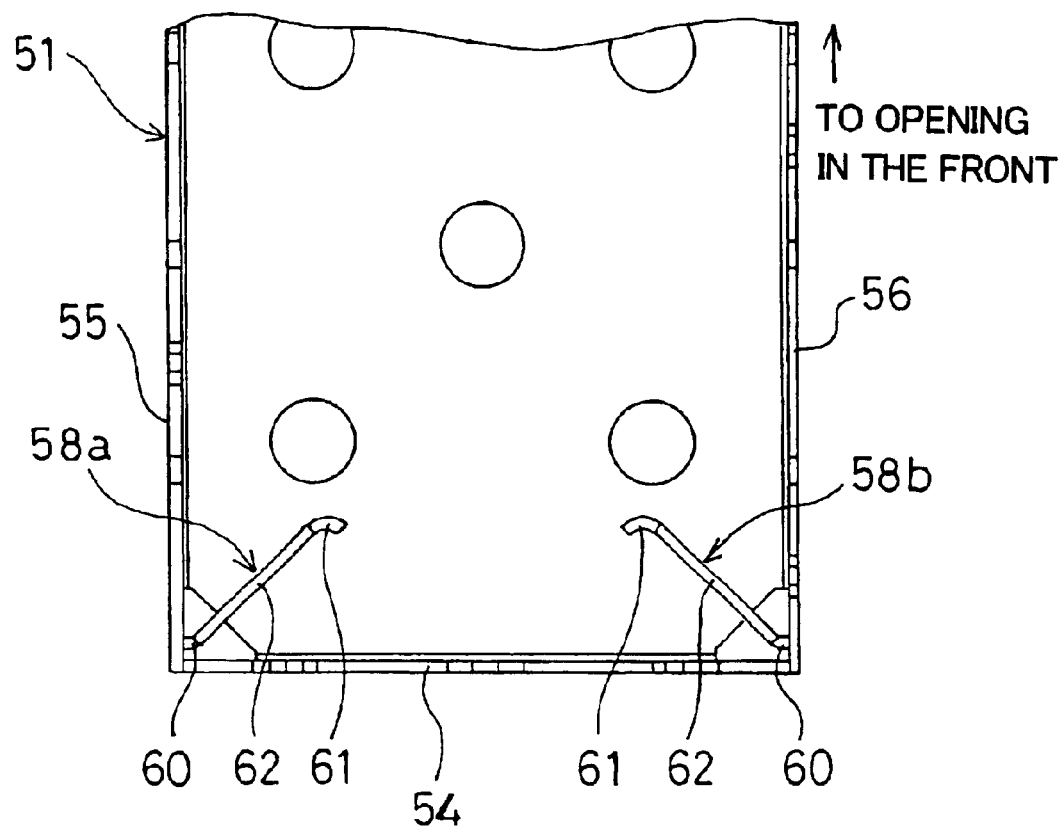
FIG. 13 is the drawing which shows the resilience pieces watched from the base side in the conventional transceiver cage.

FIG. 9–FIG. 11 show the seventh, the eighth, the ninth embodiment respectively. FIG. 9–FIG. 11 are the drawings showing resilience pieces watched from the first opening 7 on the front side.

Each resilience piece 29a, 29b 30a, 30b, 31a, 31b of transceiver cages in FIG. 9–FIG. 11 is formed to make a width of either resilience pieces 8a, 8b in the first embodiment smaller gradually from the first bend section 10 to the second bend section 11.

In the resilience pieces 29a, 29b shown in FIG. 9, when the resilience pieces 29a, 29b are watched from the front side, each bottom line of the resilience pieces 29a, 29b raises gradually so as to make a width of each resilience piece 8a, 8a smaller gradually.

Other things except these are similar to the first embodiment, so description is omitted.

In the resilience pieces 30a, 30b shown in FIG. 10, when the resilience pieces 30a, 30b are watched from the front side, each top line of the resilience pieces 30a, 30b falls down gradually so as to make a width of each resilience piece 8a, 8a smaller gradually.

Other things except these are similar to the first embodiment, so description is omitted.

In the resilience pieces 31a, 31b shown in FIG. 11, when the resilience pieces 31a, 31b are watched from the front side, each top line of the resilience pieces 31a, 31b falls down gradually and each bottom line of the resilience pieces 31a, 31b raises gradually so as to make a width of each resilience piece 8a, 8a smaller and gradually.

Other things except these are similar to the first embodiment, so description is omitted.

Although the present invention has been described in its preferred embodiments, it is to be understood that the invention is not limited thereto and that various changes and modifications may be made without departing from the spirit and scope of the invention.

What is claimed is:

1. A transceiver cage to accommodate a transceiver module, comprising:

a housing including a top plate, a bottom plate, a back plate, a first side plate and a second side plate and having an opening at a front of the housing, the transceiver module being inserted in the housing from the opening, at least one resilience piece protruding from an inner wall of the housing toward the front, and a latch holding the transceiver module accommodated in the housing against a force of the resilience piece, wherein the transceiver module is detachably accommodated in the transceiver cage by locking and releasing the latch, the resilience piece comprising, a first bend section comprising a proximal end for joining the housing and the resilience piece, a second bend section comprising a protruding end, and at least one intermediate bend section provided between the first bend section and the second bend section.

* * * * *